US012096667B2

(12) United States Patent
Kim et al.

(10) Patent No.: US 12,096,667 B2
(45) Date of Patent: Sep. 17, 2024

(54) DISPLAY DEVICE FOR IMPROVING TRANSMISSION EFFICIENCY OF TRANSMISSION PARTS AND LUMINANCE OF EMISSION PARTS

(71) Applicant: LG Display Co., Ltd., Seoul (KR)

(72) Inventors: Yong Il Kim, Dangjin-si (KR); Jin Bok Lee, Paju-si (KR); Na Ra Shin, Seoul (KR)

(73) Assignee: LG DISPLAY CO., LTD., Seoul (KR)

( * ) Notice: Subject to any disclaimer, the term of this patent is extended or adjusted under 35 U.S.C. 154(b) by 492 days.

(21) Appl. No.: 17/344,834

(22) Filed: Jun. 10, 2021

(65) Prior Publication Data

US 2022/0005916 A1 Jan. 6, 2022

(30) Foreign Application Priority Data

Jul. 6, 2020 (KR) ........................ 10-2020-0082921

(51) Int. Cl.

| | |
|---|---|
| ***H10K 59/131*** | (2023.01) |
| ***H10K 50/818*** | (2023.01) |
| ***H10K 50/828*** | (2023.01) |
| ***H10K 59/122*** | (2023.01) |

(52) U.S. Cl.

CPC ......... *H10K 59/131* (2023.02); *H10K 50/818* (2023.02); *H10K 50/828* (2023.02); *H10K 59/122* (2023.02)

(58) Field of Classification Search

CPC .. H10K 59/131; H10K 59/122; H10K 50/818; H10K 50/828

USPC ........................................................ 257/40, 59

See application file for complete search history.

(56) References Cited

U.S. PATENT DOCUMENTS

| | | | | |
|---|---|---|---|---|
| 2009/0256168 A1* | 10/2009 | Taneda | H10K 59/1315 | 257/E33.061 |
| 2014/0035456 A1* | 2/2014 | Isa | H10K 59/38 | 313/498 |
| 2014/0183479 A1* | 7/2014 | Park | H10K 59/1315 | 438/34 |
| 2016/0013438 A1* | 1/2016 | Im | H10K 59/1315 | 257/762 |
| 2017/0077437 A1* | 3/2017 | Kaida | H10K 50/81 | |
| 2018/0120620 A1* | 5/2018 | Shim | H10K 59/122 | |
| 2018/0175320 A1* | 6/2018 | Lee | H10K 50/81 | |
| 2018/0315950 A1* | 11/2018 | Im | H10K 50/828 | |

FOREIGN PATENT DOCUMENTS

| | | |
|---|---|---|
| KR | 10-2018-0014404 A | 2/2018 |
| KR | 10-2018-0077767 A | 7/2018 |

* cited by examiner

*Primary Examiner* — Lex H Malsawma
*Assistant Examiner* — Eric W Jones
(74) *Attorney, Agent, or Firm* — POLSINELLI PC

(57) ABSTRACT

A display device that can prevent deformation of a reflective electrode in a structure has an auxiliary connection pattern formed of the same materials of an anode including the reflective electrode for high reflection characteristics, so as to ensure a reliable voltage drop structure of a cathode and to improve transmission efficiency of transmission parts and luminance of emission parts in a structure having both the transmission parts and the emission parts.

19 Claims, 5 Drawing Sheets

DISPLAY DEVICE FOR IMPROVING TRANSMISSION EFFICIENCY OF TRANSMISSION PARTS AND LUMINANCE OF EMISSION PARTS

CROSS-REFERENCE TO RELATED APPLICATION

This application claims the benefit of Korean Patent Application No. 10-2020-0082921, filed on Jul. 6, 2020, which is hereby incorporated by reference in its entirety.

BACKGROUND

Field of the Disclosure

The present disclosure relates to a display device, and more particularly, to a display device which can prevent deformation of a reflective electrode in a structure, having an auxiliary connection pattern formed of the same materials of an anode including the reflective electrode for high reflection characteristics, so as to ensure a reliable voltage drop structure of a cathode and to improve transmission efficiency of transmission parts and luminance of emission parts in a structure having both the transmission parts and the emission parts.

Description of the Background

As society has recently entered the information age, the field of displays for visually displaying electrical information signals has rapidly developed and, in order to satisfy such development, various display devices having excellent performance, such as slimness, light weight and low power consumption, have been developed and have rapidly replaced conventional cathode ray tubes (CRTs).

There among, self-light emitting display devices, which do not require separate light sources, achieve compactness and clear color display and include light emitting devices within a display panel, are considered as competitive applications.

In light emitting devices provided in respective subpixels of a display device, because one electrode is integrally provided throughout the entirety of an active area of the display device, an auxiliary connection part, configured to prevent voltage drop in a region far away from a region, to which voltage is applied, of the electrode integrally formed throughout the subpixels, is required.

SUMMARY

Accordingly, the present disclosure is directed to a display device, which includes an auxiliary connection part so as to prevent voltage drop of a cathode and to improve both transmission efficiency of transmission parts and luminance of emission parts in a structure having the transmission parts and the emission parts, that substantially obviates one or more problems due to limitations and disadvantages of the prior art.

The present disclosure provides a display device which prevents a highly reflective metal layer provided to improve reflection efficiency in the layer structure of an anode (first electrode) overlapping an auxiliary wiring by changing the layer structure of the anode and bank correspondent relationships thereof, so as to prevent deformation of the highly reflective metal layer and to realize stable connection between the auxiliary wiring or an auxiliary connection pattern and a cathode (second electrode).

Additional advantages and features of the disclosure will be set forth in part in the description which follows and in part will become apparent to those having ordinary skill in the art upon examination of the following or may be learned from practice of the disclosure. Other advantages of the disclosure may be realized and attained by the structure particularly pointed out in the written description and claims hereof as well as the appended drawings.

To achieve these and other advantages and in accordance with the purpose of the disclosure, as embodied and broadly described herein, a display device includes an auxiliary wiring on a substrate, a bank configured to include a first hole configured to expose a part of the auxiliary wiring and second holes configured to expose emission parts, an auxiliary connection pattern formed by stacking a reflective metal layer and a first transparent electrode layer between the auxiliary wiring and the bank, configured such that at least the reflective metal layer is spaced apart from a side wall of the bank configured to form the first hole by a first distance, and connected to the auxiliary wiring, light emitting devices respectively provided in the emission parts, and including a first electrode including the same materials as the auxiliary connection pattern, an organic layer and a second electrode.

In another aspect of the present disclosure, a display device includes an auxiliary wiring on a substrate, a bank configured to include a first hole configured to expose a part of the auxiliary wiring, second holes configured to expose emission parts, and third holes configured to expose transmission parts, an auxiliary connection pattern formed by stacking a reflective metal layer and a first transparent electrode layer between the auxiliary wiring and the bank, configured such that at least the reflective metal layer is spaced apart from a side wall of the bank configured to form the first hole by a first distance, and connected to the auxiliary wiring, and light emitting devices respectively provided in the emission parts, and including a first electrode including the same materials as the auxiliary connection pattern, an organic layer, and a second electrode connected to the auxiliary wiring or the auxiliary connection pattern within the first distance.

It is to be understood that both the foregoing general description and the following detailed description of the present disclosure are exemplary and explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of this application, illustrate aspect(s) of the disclosure and together with the description serve to explain the principle of the disclosure.

In the drawings.

DETAILED DESCRIPTION

Figure 1:
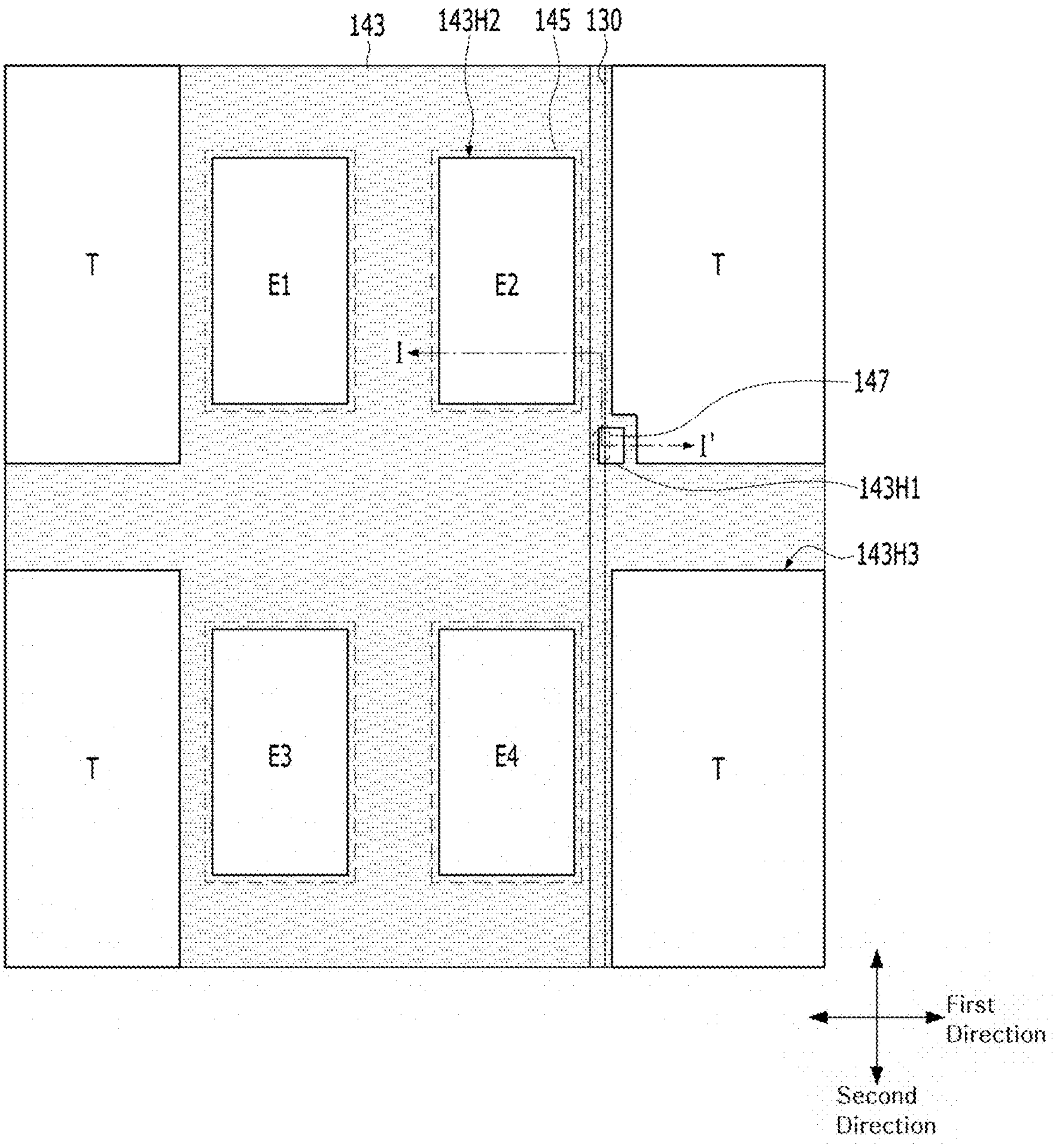
FIG. 1 is a plan view illustrating a display device according to one aspect of the present disclosure.

Reference will now be made in detail to the exemplary aspects of the present disclosure, examples of which are illustrated in the accompanying drawings. In the following description of the aspects and the drawings, the same or similar elements are denoted by the same reference numerals throughout the specification. In the following description of the aspects of the present disclosure, a detailed description of known functions and configurations incorporated herein will be omitted when it may make the subject matter of the present disclosure rather unclear. Further, the names of elements used in the following description of the aspects of the present disclosure are selected in consideration of ease of preparation of the specification, and may thus differ from the names of parts of an actual product.

The shapes, sizes, ratios, angles and numbers of elements given in the drawings to describe the aspects of the present disclosure are merely exemplary, and thus, the present disclosure is not limited to the illustrated details. In the following description of the aspects, the terms "including", "comprising" and "having" are to be interpreted as indicating the presence of one or more other characteristics, numbers, steps, operations, elements or parts stated in the specification or combinations thereof, and do not exclude the presence of other characteristics, numbers, steps, operations, elements, parts or combinations thereof, or the possibility of adding the same, unless the term "only" is used. It will be understood that a singular expression of an element(s) encompasses a plural expression unless stated otherwise.

In interpretation of elements included in the various aspects of the present disclosure, it is to be interpreted that the elements include error ranges unless stated otherwise.

In the following description of the aspects, it will be understood that, when positional relationships are expressed, for example, when an element is said to be "on", "above", "under" or "beside" another element, the two elements may directly contact each other, or one or more other elements may be interposed between the two elements, unless the term "just" or "directly" is used.

In the following description of the aspects, it will be understood that, when the terms "first", "second", etc. are used to describe various elements, these terms are used merely to distinguish the same or similar elements. Therefore, a first element described hereinafter could be termed a second element without departing from the technical scope of the disclosure.

Respective features of the various aspects of the present disclosure may be partially or wholly coupled to or combined with each other and be interlocked or driven in various technical manners, and the respective aspects may be implemented independently of each other or be implemented together through connection there between.

Hereinafter, a display device according to the present disclosure will be described with reference to the accompanying drawings.

Figure 2:
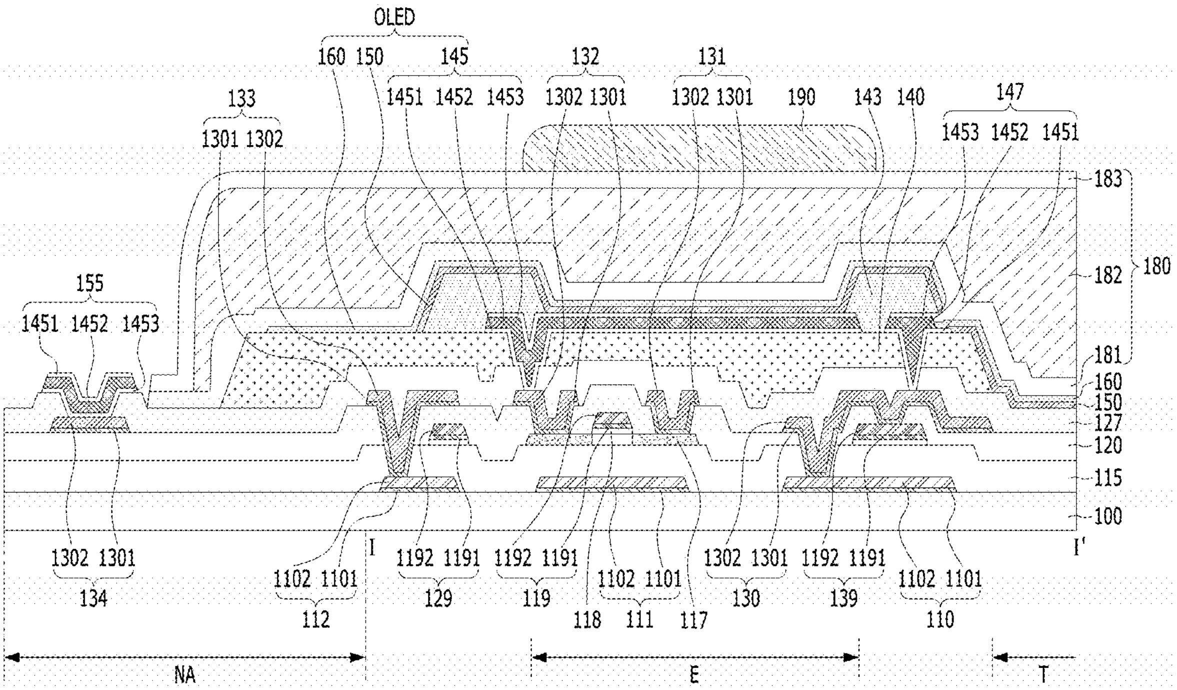
FIG. 2 is a cross-sectional view of a display device according to a first aspect of the present disclosure, taken along line I-I' of FIG. 1, and illustrating a non-active area.

FIG. 1 is a plan view illustrating a display device according to one aspect of the present disclosure, and FIG. 2 is a cross-sectional view of a display device according to a first aspect of the present disclosure, taken along line I-I' of FIG. 1, and illustrating a non-active area.

As shown in FIGS. 1 and 2, the display device according to the first aspect of the present disclosure includes an auxiliary wiring 130 on a substrate 100, a bank 143 having a first hole 143H1 configured to expose a part of the auxiliary wiring 130 and second holes 143H2 configured to expose emission parts E: E1, E2, E3 and E4, and an auxiliary connection pattern 147 provided between the auxiliary wiring 130 and the bank 143. The auxiliary connection pattern 147 may have the same layer structure as that of a first electrode 145 of a light emitting device OLED.

Here, the light emitting device OLED including the first electrode 145 including the same materials as the auxiliary wiring 130, an organic layer 150 and a second electrode 160 may be provided in each of the emission parts E: E1, E2, E3 and E4. The organic layer 150 includes an emission layer, and the emission layer may be an organic emission layer, an inorganic emission layer including quantum dots, or a hybrid emission layer including an organic material and an inorganic material. In addition to the emission layer, the organic layer 150 may further include at least one of a hole injection layer, an auxiliary hole transport layer, a hole transport layer or an electron barrier layer, under the emission layer, and may further include at least one of a hole barrier layer, an electron transport layer or an electron injection layer, on the emission layer. In some cases, the organic layer 150 may include a plurality of stacks divided from each other by a charge generation layer. In this case, each stack may include a hole transport layer, an emission layer and an electron transport layer. One or more layers forming the organic layer 150 may be formed in the active area AA of the substrate 100 without a mask for region division. The active area AA in which display is substantially realized means an area of the substrate 100 except for pad electrodes 155, a link part connected to the pad electrodes 155 and/or a gate-in-panel (GIP) circuit. The active area AA may include the emission parts E: E1, E2, E3 and E4, transmission parts T, and regions between the emission parts E: E1, E2, E3 and E4 and transmission parts T, occupied by the bank 143.

The emission parts E: E1, E2, E3 and E4 may be defined by the second holes 143H2 of the bank 143, and the transmission parts T may be defined by third holes 143H3 of the bank 143. After forming the bank 143, at least a hole injection layer, a hole transport layer, an electron transport layer, an electron injection layer and the second electrode 160 may be formed in common in the active area AA. A fine metal mask (FMM) having fine openings having the size of the respective emission parts E: E1, E2, E3 and E4 may not be required so as to form these layers, and when the organic layer 150 and the second electrode 160 is formed without an FMM, some or all of the respective layers forming the organic layer 150 may be successively formed throughout the emission parts E: E1, E2, E3 and E4 and the transmission parts T without interruption. In this case, because not only the organic layer 150 but also the second electrode 160 is formed without an FMM, it is difficult to connect the second electrode 160 directly to the auxiliary wiring 130 due to presence of the organic layer 150 located under the second electrode 160, and thus, in the display device according to the present disclosure, a void part UC is provided around the first hole 143H1 of the bank 143 before formation of the organic layer 150, and thus, the second electrode 160 is conductively connected to the auxiliary wiring 130 by the relative protruding structure of the void part UC compared to the auxiliary connection pattern 147.

That is, the display device according to the present disclosure, the bank 143 protrudes from the auxiliary connection pattern 147 without changing a deposition mask or using an FMM mask, and thus, when the organic layer 150 is deposited in the region in which the bank 143 protrudes, the organic layer 150 does not enter the void part UC due to straightness thereof, and when the second electrode 160 including an inorganic material and thus having excellent step coverage characteristics is formed, the second electrode 160 rather than the organic layer 150 is directly connected to the auxiliary connection pattern 147 or the auxiliary wiring 130. Therefore, in the display device according to the present disclosure, the second electrode (cathode) 160 may be connected to the auxiliary wiring 130 or the auxiliary connection pattern 147 without adding or changing a mask for the organic layer 150.

In the display device according to the present disclosure, the auxiliary connection pattern 147 and the first electrode (anode) 145 essentially include a reflective metal layer 1452 and a first transparent electrode layer 1453, and may further include a second transparent electrode layer 1451 under the reflective metal layer 1452, as shown in FIG. 2. Here, among the layer structure of the auxiliary connection pattern 147, the reflective metal layer 1452 occupies the majority of the thickness of the auxiliary connection pattern 147, and the sum of the thicknesses of the first and second transparent electrode layers 1453 and 1451 is less than the thickness of the reflective metal layer 1452. The reflective metal layer 1452 in the first electrode 145 functions to reflect light emitted downwards so as to return the light forwards, when the emission layer of the light emitting device OLED provided in the emission part emits light, thus increasing luminous efficacy. Further, because the reflective metal layer 1452 is formed of a metal having higher conductivity than the transparent oxide of the first and second transparent electrode layers 1453 and 1452 located on and under the reflective metal layer 1452, the reflective metal layer 1452 is formed to have a designated thickness or more, and thus improves the conductivity of the auxiliary connection pattern 147. In addition, in the display device according to the present disclosure, the void part UC is provided in a region in which at least the reflective metal layer 1452 of the auxiliary connection pattern 147 is removed, and the second electrode 160 may enter the void part UC. Therefore, in order to prevent the organic layer 150 from closing the side part of the void part UC during continuous deposition of the organic layer 150 and the second electrode 160, the thickness of the reflective metal layer 1452 occupying the majority of the thickness of the void part UC may be greater than the sum of the thicknesses of the organic layer 150 and the second electrode 160. Therefore, when the organic layer 150 is deposited, the material of the organic layer 150 having high straightness is accumulated on the side wall of the bank 142 surrounding the exposed first hole 143H1 on the auxiliary wiring 130, and thus, the organic layer 150 is accumulated in the first hole 143H1 outside the void part UC having a great vertical distance from the lower end of the bank 143. Further, because the second electrode 160 formed on the organic layer 150 is formed of a transparent or transflective component, such as IZO or ITO, and thus has excellent step coverage characteristics, the second electrode 160 may enter a portion or the entirety of the void part UC while overlying the organic layer 150.

In the emission parts E: E1, E2, E3 and E4, the first electrode 145 includes a reflective electrode, the second electrode 160 includes a transparent electrode or a transflective electrode, and thus, emitted light is output upwards, i.e., towards an encapsulation layer structure 180. Further, the transmission parts T transmit light in two directions, i.e., towards the substrate 100 and towards the encapsulation layer structure 180.

In the display device according to the present disclosure, the auxiliary connection pattern 147 is formed to have the same layer structure as the first electrode 145, and when the auxiliary connection pattern 147 includes the reflective metal layer 1452 and the first transparent metal layer 1453, the reason why the void part UC is formed by removing these layers 1452 and 1453 is to prevent deformation of the reflective metal layer 1452 caused by exposure of the reflective metal layer 1452 to the outside.

In the display device according to the present disclosure, the reflective metal layer 1452 included in the first electrode 145 and the auxiliary connection pattern 147 may employ a highly reflective metal, for example, silver (Ag) or an alloy including silver (Ag), so as to reflect light emitted by the emission layer of the light emitting device OLED upwards. However, because silver (Ag) or the Ag alloy tends to be oxidized when exposed to the outside, when the reflective metal layer 1452 has a protruding structure so as to be connected to the auxiliary wiring 130, the reflective metal layer 1452 may rise and swell or be deformed. In the display device according to the present disclosure, the auxiliary connection pattern 147 including the reflective metal layer 1452 is located inside the bank 143 in the structure in which the reflective metal layer 1452 is included in the first electrode 145 and the auxiliary connection pattern 147, thereby being capable of preventing deformation of the reflective metal layer 1452.

In the display device according to the present disclosure, the first transparent electrode layer 1453 is provided so as to reduce barriers at the interface between the first transparent electrode layer 1453 and the organic layer 150 and to improve interface matching characteristics, and the second transparent electrode layer 1451 may be further provided so as to improve contact characteristics with a second source/drain metal layer 1302 provided thereunder and to reduce process resistance. The second transparent electrode layer 1451 may be omitted, and the second source/drain metal layer 1302 may be in direct contact with the reflective metal layer 1452.

In the auxiliary connection pattern 147, when the second transparent electrode layer 1451 is provided under the reflective metal layer 1452, as shown in FIG. 2, the second transparent electrode layer 1451 may extend not only to the void part UC but also to the inside of the first hole 143H1, so as to directly connect a part of the auxiliary connection pattern 147, i.e., the second transparent electrode layer 1451, to the second electrode 160. Therefore, in the display device according to the present disclosure, when the first electrode (anode) 145 formed to have the same layer structure as the auxiliary connection pattern 147 employs a highly reflective metal, such as Ag or an Ag alloy, the void part UC is provided such that the auxiliary connection pattern 147 is be formed farther inwards than the bank 143 provided thereon, and thereby, efficiency of the emission parts E: E1, E2, E3 and E4 may be improved and voltage drop of the second electrode (cathode) 160 may be prevented through an undercut structure between the bank 143 and the auxiliary connection pattern 147. That is, nonuniformity in resistance of the second electrode 160 among regions may be prevented, and thus, afterimage prevention and image stabilization may be promoted.

Particularly, in the structure of a transparent display device which has both transmission parts and emission parts, the use of wirings or metal layers for shielding light in the transmission parts is limited in order to transmit light in the transmission parts, and in the emission parts in which some wirings and thin film transistors need to be provided, when an auxiliary connection pattern includes a reflective metal layer having a designated thickness or more, the auxiliary connection pattern forms a void part by selectively removing the reflective metal layer so as to prevent deposition of an organic layer therein, shields the wirings and the thin film transistors provided in the emission pats, and reflects light, emitted downwards by emission layers, upwards so as to improve luminous efficacy.

In the structure in which the first electrode essentially uses a highly reflective metal, such as Ag or an Ag alloy, and the auxiliary connection pattern has the same layer structure as the first electrode, the reflective metal layer formed of the highly reflective metal may be located father inwards than the bank so as to prevent oxidation of the reflective metal layer or shape deformation of the reflective metal layer. Thereby, more stable connection between the second electrode and the auxiliary wiring or the auxiliary connection pattern may be realized.

Referring to FIG. 1, the bank 143 is provided between the emission parts E: E1, E2, E3 and E4 and between the emission parts E: E1, E2, E3 and E4 and the transmission parts T. For example, the emission parts E: E1, E2, E3 and E4 which are divided from one another may include blue emission parts, red emission parts, green emission parts and white emission parts, without being limited thereto. In some cases, the white emission parts are omitted, and only blue emission parts, red emission parts and green emission parts may be provided. Further, a combination of different color emission parts, for example, cyan emission parts, magenta emission parts and yellow emission parts, may be provided.

Further, the different color emission parts E1, E2, E3 and E4 may be implemented by providing emission layers configured to emit light with different colors within the organic layer 150, or may be implemented by providing emission layers configured to emit white light in common within the organic layer 150 and further providing a color filter layer 190 configured to transmit light with a designated color corresponding to each of the emission parts on the light emitting device OLED. When the color filter layer 190 is provided, the white emission parts may omit the color filter layer 190, and the remaining emission parts, i.e., the blue, red and green emission parts, may include the color filter layer 190. Although FIG. 2 illustrates the color filter layer 190, the disclosure is not limited thereto, and the color filter layer 190 may be omitted and the respective emission parts E1, E2, E3 and E4 may be implemented by providing different color emission layers. When the respective emission parts E1, E2, E3 and E4 include different color emission layers, an FMM having openings corresponding to at least the emission parts E1, E2, E3 and E4 may be used to form the emission layers.

In the light emitting devices OLED, the first electrodes 145 serving as the anodes are separately provided in the respective emission parts E1, E2, E3 and E4, and the first electrodes 145, each of which is connected to a thin film transistor TFT, may be independently operated in the respective emission parts E1, E2, E3 and E4.

The edge of the first electrode 145 may overlap the bank 143, and the first electrode 145 and the organic layer 150 and the second electrode 160, which are sequentially stacked on a region of the first electrode 145 exposed from the second hole 143H2 of the bank 143, form the light emitting device OLED.

Although FIG. 1 illustrates that the emission parts E1, E2, E3 and E4 and the transmission parts T have a rectangular shape, the disclosure is not limited thereto, and they may have a polygonal shape.

As shown in FIG. 1, the transmission part T, the blue emission part E1, the red emission part E2 and the transmission part T may be arranged in a first direction in a first row, and the transmission part T, the green emission part E3, the white emission part E4 and the transmission part T may be arranged in the first direction in a second row. However, this arrangement is only one example, the arrangement of the respective color emission parts E1, E2, E3 and E4 may be changed, and the area of specific color emission parts may be increased or a larger number of specific color emission parts may be provided depending on an environment in which the display device is used, or the model of the display device.

In FIG. 1, thin film transistors and wirings connected to the thin film transistors may be provided in regions in which the first electrodes 145 and the bank 143 overlap, and the illustration of the thin film transistors and the wirings is omitted because various arrangements thereof are possible. For example, gate lines (scan lines) may be arranged in the first direction, and data lines and power supply voltage lines VDDL may be arranged in a second direction.

Although FIG. 1 illustrates that the auxiliary wiring 130 is arranged in the second direction between the emission parts E2 and E4 and the transmission parts T, the disclosure is not limited, and the auxiliary wiring 130 may be arranged in the first direction or be arranged in both the first and second directions. The auxiliary wiring 130 may be formed in the same layer as a light-shielding layer 110, may be formed in the same layer as a gate electrode 119 and/or the gate line (not shown), or may be formed in the same layer as a source electrode 131, a drain electrode 132 and the data line (not shown). FIG. 2 illustrates an example in which the auxiliary wiring 130 is formed in the same layer as the source electrode 131 and the drain electrode 132.

Further, when the area of the transmission parts T is greater than the area of the emission parts E1, E2, E3 and E4, as shown in this figure, it is advantageous to improve light transmittance in a transparent display device.

However, in this case, because display of an image must be realized only by driving the emission parts E1, E2, E3 and E4 having a relatively reduced area, the emission parts E1, E2, E3 and E4 having the reduced area must have high efficiency and thus the reflective metal layer 1452 used in the first electrode 145 must include a highly reflective metal.

The structure of the display device according to the present disclosure is advantageous to a transparent display device, and although the reflective metal layer 1452 used in the first electrode 145 in the emission parts E1, E2, E3 and E4 employs a highly reflective metal, such as Ag or an Ag alloy, deformation of the reflective metal layer 1452 may be prevented by changing the structure of the auxiliary connection part. That is, the auxiliary connection pattern 147 having the same layer structure as the first electrode 145 is formed inside the bank 143 so as not to be exposed from the bank 143 in the void part, in which the auxiliary connection pattern 147 is directly connected to the second electrode 160, thereby being capable of preventing deformation of the reflective metal layer 1452 during oxidation or a firing process of the bank 143.

The auxiliary wiring 130 may be formed in the second direction, i.e., in the vertical direction, as shown in FIG. 1, or may be formed in the first direction crossing the second direction, i.e., in the horizontal direction.

Figure 3:
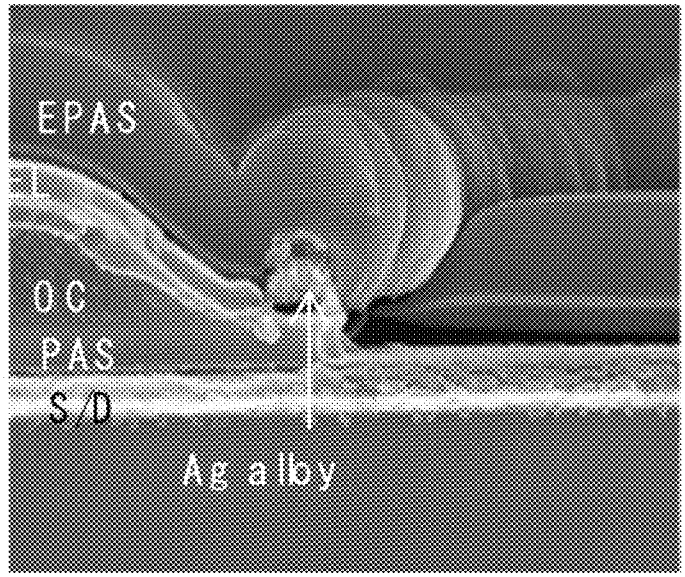
FIG. 3 is an SEM image of a display device to which an undercut structure according to Test Example 1 is applied.

FIG. 3 is an SEM image of a display device to which an undercut structure according to Test Example 1 is applied.

As shown in FIG. 3, if an anode dummy pattern includes Ag having high reflection characteristics, such as an ITO/Ag alloy/ITO, when the anode dummy pattern protrudes relatively to an overcoat layer provided thereunder and thus an undercut structure between the anode dummy pattern and the overcoat layer is formed, Ag in the protruding anode dummy pattern is oxidized, and thus rises and swells, and causes deformation of the shapes of an organic layer EL and a cathode, which are subsequently formed thereon, thereby causing a connection failure between an auxiliary wiring S/D and a cathode.

In a display device including transmission parts, because the area of emission parts is reduced due to presence of the transmission parts, the respective emission parts require high efficiency and, when the dummy pattern of a first electrode (anode) including a highly reflective metal has a protruding tip in situations in which use of the highly reflective metal is essential, the failure shown in FIG. 3 may occur. Therefore, the inventors of the present disclosure propose a method which, when an undercut part (void part) is formed, an auxiliary connection pattern formed in the same layer as the first electrode does not protrudes but a bank provided on the auxiliary connection pattern protrudes relatively to the auxiliary connection pattern. Thereby, exposure of the auxiliary connection pattern including a reflective metal layer to the outside is prevented, and deformation of the auxiliary connection pattern is prevented, and thus, a reliable connection structure between the auxiliary wiring and a second electrode may be realized.

Hereinafter, elements, which have not been described above with reference to FIG. 2, will be described.

The thin film transistor TFT includes a semiconductor layer 117, a gate electrode 119 configured to overlap the channel of the semiconductor layer 117 with a gate insulating film 118 interposed therebetween, and the source electrode 131 and the drain electrode 132 spaced apart from the gate electrode 119 and connected to both sides of the semiconductor layer 117.

A light-shielding layer 111 is provided below the semiconductor layer 117 so as to prevent changes in the driving characteristics of the thin film transistor due to transmission of light to the channel. The light-shielding layer 110 may be further provided in a region overlapping the auxiliary wiring 130 in the same layer as the light-shielding layer 111. Further, a first storage electrode 112 may be formed in a storage capacitor region in the same layer as the light-shielding layers 110 and 111.

The light-shielding layers 110 and 111 and the first storage electrode 112 may include a first metal layer 1101 and a second metal layer 1102, as shown in this figure. However, the disclosure is not limited thereto, and the light-shielding layers 110 and 111 and the first storage electrode 112 may be formed as a single layer or include a plurality of layers. The first and second metal layers 1101 and 1102 may be formed of a metal having high conductivity, such as aluminum (Al), chrome (Cr), copper (Cu), titanium (Ti), molybdenum (Mo) or tungsten (W), or an alloy including at least one of these metals. Particularly, when the first and second metal layers 1101 and 1102 include a metal or a metal alloy, which may collect hydrogen, such as MoTi, the first and second metal layers 1101 and 1102 may prevent deformation of the semiconductor layer 117 due to hydrogen included in the substrate 100 or a first interlayer insulating film 115.

Although this figure illustrates an example in which the light-shielding layers 110 and 111 and the first storage electrode 112 are formed on the substrate 100, the disclosure is not limited thereto, and a buffer layer (not shown) may be further provided between the substrate 100, and the light-shielding layers 110 and 111 and the first storage electrode 112.

The semiconductor layer 117 may be formed on the first interlayer insulating film 115, and both sides of the semiconductor layer 117 except for the channel may be doped with impurities or be treated so as to have conductivity, thereby being capable of lowering contact resistance with the source electrode 131 and the drain electrode 132.

The gate electrode 119 overlapping the channel of the semiconductor layer 117 may be formed using the same mask as the gate insulating film 118, and may thus have the same width as the gate insulating film 118.

The gate electrode 119 and a second storage electrode 129 overlapping the first storage electrode 112 and having the same layer structure as the gate electrode 119 may be formed.

A lower connection pattern 139 may be further provided under the auxiliary wiring 130 in the same layer as the gate electrode 119, and the lower connection pattern 139 is selectively provided and may thus be omitted in some cases. The second storage electrode 129 and the lower connection pattern 139 may be located on the first interlayer insulating film 115. The gate electrode 119, the second storage electrode 129 and the lower connection pattern 139 may be formed by stacking third and fourth metal layers 1191 and 1192, and the third and fourth metal layers 1191 and 1192 may be formed of a metal having high conductivity, such as aluminum (Al), chrome (Cr), copper (Cu), titanium (Ti), molybdenum (Mo) or tungsten (W), or an alloy including at least one of these metals. Particularly, when the third and fourth metal layers 1191 and 1192 include a metal or a metal alloy, which may collect hydrogen, such as MoTi, the third and fourth metal layers 1191 and 1192 may prevent deformation of the semiconductor layer 117 due to hydrogen included in the first interlayer insulating film 115, the gate insulating film 118 and a second interlayer insulating film 120. The gate electrode 119, the second storage electrode 129 and the lower connection pattern 139 may have the two-layer structure shown in this figure, or may be formed in a single layer or have a structure including three or more layers.

The second interlayer insulating film 120 is provided so as to overlie the gate electrode 119, the second storage electrode 129 and the lower connection pattern 139.

Further, the source electrode 131, the drain electrode 132, a first storage connection pattern 133 connected to the first storage electrode 112, the auxiliary pattern 130 and an auxiliary pad electrode 134 may be formed by sequentially stacking fifth and sixth metal layers 1301 and 1302 and then patterning the fifth and sixth metal layers 1301 and 1302. The fifth and sixth metal layers 1301 and 1302 may be formed of a metal having high conductivity, such as aluminum (Al), chrome (Cr), copper (Cu), titanium (Ti), molybdenum (Mo) or tungsten (W), or an alloy including at least one of these metals. The source electrode 131, the drain electrode 132, the first storage connection pattern 133, the auxiliary pattern 130 and the auxiliary pad electrode 134 may have the two-layer structure shown in this figure, or may be formed in a single layer or have a structure including three or more layers.

A passivation film 127 may be formed to overlie the source electrode 131, the drain electrode 132, the first storage connection pattern 133, the auxiliary pattern 130 and the auxiliary pad electrode 134 so as to protect the same.

An overcoat layer 140 may be formed on the passivation layer 127 so as to planarize the surface of the passivation layer 127. A first contact hole configured to expose the upper surface of the drain electrode 132, a second contact hole configured to expose a part of the auxiliary wiring 130, and a third contact hole configured to expose the auxiliary pad electrode 134 may be formed by selectively removing the overcoat layer 140 and the passivation film 127.

Thereafter, the first electrode 145 connected to the drain electrode 132 through the first contact hole and the auxiliary connection pattern 147 spaced apart from the first electrode 145 so as to be electrically insulated therefrom and connected to the auxiliary wiring 130 through the second contact hole may be formed by stacking a metal stack structure including the reflective metal layer 1452 and the first transparent electrode layer 1453 and then patterning the metal stack structure. In the same process, the pad electrode 155 connected to the auxiliary pad electrode 134 through the third contact hole may be formed.

The first electrode 145, the auxiliary connection pattern 147 and the pad electrode 155 may further include the second transparent electrode layer 1451 provided under the reflective metal layer 1452 in addition to the above-described reflective metal layer 1452 and first transparent electrode layer 1453, as shown in FIG. 2. When the second transparent electrode layer 1451 is further provided, the second transparent electrode layer 1451 of the auxiliary connection pattern 147 extends farther sideward than the reflective metal layer 1452 and the first transparent electrode layer 1453 provide thereon, and may thus guide conductive connection to the second electrode 160 in the void part UC which will be formed subsequently.

The reflective metal layer 1452 may be formed of a metal having high reflectivity, for example, silver (Ag) or an ally including silver (Ag). However, the disclosure is not limited thereto, and the reflective metal layer 1452 may be formed of a metal having high reflectivity which is similar to or greater than the reflectivity of Ag—Pd—Cu (APC). The reflective metal layer 1452 is in charge of the reflective characteristics of the first electrode 145, i.e., functions to reflect light, emitted by the organic layer 150 towards the first electrode 145, so as to turn the light upwards, and secures conductivity in the layer structure of the first electrode 145. Further, the reflective metal layer 1452 has a width difference with the bank 143 formed on the auxiliary connection pattern 147 so that the second electrode 160 may enter a region (i.e., the void part UC) from which the reflective metal layer 1452 is removed, and in order to prevent the region, from which the reflective metal layer 1452 is removed, under the bank 142 from being clogged with the organic layer 150, the thickness of the reflective metal layer 1452 may be greater than the sum of the thickness of the organic layer 150 and the thickness of the second electrode 160. The thickness of the reflective metal layer 1452 may be equal to or greater than about 3000 Å, without being limited thereto, and the thickness of the reflective metal layer 1452 is greater than the thickness of the organic layer 150 in consideration of the deposition thickness of the organic layer 150. Although FIG. 2 illustrates that both the reflective metal layer 1452 and the first transparent electrode layer 1453 provided thereon are removed from the void part UC, only the reflective metal layer 1452 may be removed from the void part UC and the first transparent electrode layer 1451 may remain at the void part UC due to a difference in etch rates of an etchant for the reflective metal layer 1452 and the first transparent electrode layer 1453, used during the process for removing the reflective metal layer 1452.

The first and second transparent electrode layers 1453 and 1451 may be the same transparent electrode, or may be different transparent electrodes. The first and second transparent electrode layers 1453 and 1451 may be formed of, for example, indium tin oxide (ITO), tin oxide (TO), indium zinc oxide (IZO), indium tin zinc oxide (ITZO), or the like.

In the display device according to the present disclosure, the reflective electrode layer 1452 may be deformed when exposed to the outside, and in order to prevent the deformation of the reflective electrode layer 1452, at least the reflective electrode layer 1452 is omitted from the void part UC. The pad electrode 155 may also have the configuration in which the reflective electrode layer 1452 is omitted. In this case, the pad electrode 155 may include a single layer, i.e., the first transparent electrode layer 1453 or the second transparent electrode layer 1451, or may have a stack structure including the first and second transparent electrode layers 1453 and 1451.

The second transparent electrode layer 1451, the reflective electrode layer 1452 and the first transparent electrode layer 1453 forming the auxiliary connection pattern 147 may have a stack structure of, for example, IZO/Ag—Pd—Cu (APC)/IZO in the upward direction. In this case, the three layers forming the auxiliary connection pattern 147 are primarily patterned, and are then secondarily patterned to have the same width after formation of the holes in the bank 143, and in this case, it is advantageous for the first and second transparent electrode layers 1453 and 1451 to be formed of the same material, i.e., IZO. When a transparent electrode layer is formed of ITO, ITO is crystallized during the firing process of the bank 143 and thus a defect may occur during secondary patterning, but when the transparent electrode layer is formed of IZO, IZO is scarcely deformed during the firing process of the bank 143 and thus patterning stability may be ensured.

Further, when both the first and second transparent electrode layers 1453 and 1451 are formed of IZO, the second transparent electrode layer 1451 located at the lowermost position of the auxiliary connection pattern 147 has excellent interface matching characteristics with the overcoat layer 140, and the first transparent electrode layer 1453 located at the uppermost position of the auxiliary connection pattern 147 has excellent matching characteristics with an organic material deposited thereon. Further, the reflective electrode layer 1452 occupying the majority of the thickness of the auxiliary connection pattern 147 and having conductivity is formed of a silver alloy, such as APC, thereby being capable of preventing cohesion of metal components and movement thereof. In this case, the first electrode 145 may also have the same layer structure as the auxiliary connection pattern 147, i.e., the stack structure of IZO/Ag—Pd—Cu (APC)/IZO in the upward direction.

Further, the auxiliary connection pattern 147 may include a lower flat part which contacts the auxiliary wiring 130, a side connection part which extends from the lower flat part and contacts the side parts of the passivation film 127 and the overcoat layer 140 located between the auxiliary wiring 130 and the bank 143, and an upper flat part which extends from the side connection part and is located on the upper surface of the overcoat layer 140.

The auxiliary connection pattern 140 is connected to the upper flat part of the auxiliary wiring 130, and prevents bends generated on the upper surface thereof when deposited.

As shown in FIG. 1, the bank 143 may have the first hole 143H1 configured to expose a part of the auxiliary wiring 130, the second holes 143H2 configured to expose the emission parts E, and the third holes 143H3 configured to expose the transmission parts T, and may be provided in the active area AA.

The organic layer 150 and the second electrode 160 are sequentially deposited on the bank 143 and in the first to third holes 143H1, 143H2 and 143H3. The second holes 143H2 and the third holes 143H3 correspond to the emission parts E and the transmission parts T, and the organic layer 150 formed in the emission parts E may be used to emit light. Here, because the organic layer 150 is formed to have straightness, the organic layer 150 is deposited in the first hole 143H1 without entering the void part UC covered by the bank 143 around the first hole 143H1. On the other hand, because the second electrode 160 has excellent step coverage, the second electrode 160 may enter the void part UC covered by the bank 143, and may thus be directly connected to the extension of the second transparent electrode layer 1451 serving as the lowermost layer of the auxiliary connection pattern 147.

The encapsulation layer structure 180 may be formed so as to overlie an area including the organic light emitting devices OLED on the substrate 100 except for the pad electrodes 155 bonded to an external circuit film (not shown).

The encapsulation layer structure 180 is formed by alternately stacking inorganic encapsulation layers 181 and 183 and an organic encapsulation layer 182, and the inorganic encapsulation layers 181 and 183 extend farther outwards than the organic encapsulation layer 182 and are thus exposed to the outside so as to protect the organic encapsulation layer 182 which is relatively vulnerable to moisture. The inorganic encapsulation layers 181 and 183 may prevent ambient moisture or air from flowing into the display device, and the organic encapsulation layer 182 may prevent particles from moving in the display device and influencing the inside of the encapsulation layer structure 180.

In the encapsulation layer structure 180, the organic encapsulation layer 182 has a greater thickness then those of the inorganic encapsulation layers 181 and 183, and may be planarized. Among the inorganic encapsulation layers 181 and 183, the first inorganic encapsulation layer 181 on the array on the substrate 100 having steps may be formed to reflect the steps provided thereunder.

The encapsulation layer structure 180 may be formed in the entirety of the active area AA and in a part of the non-active area around the active area AA.

The color filter layer 190 may be provided on the encapsulation layer structure 180. In addition, a touch electrode array (not shown) may be further provided on the encapsulation layer structure 180.

The auxiliary connection pattern 147 is formed during the same process as the first electrode 145, and includes the same materials as the first electrode 145 provided in the emission part E. Particularly, when the display device is used as a transparent display device, the area allocated to the emission parts E is reduced due to an increase in the area of the transmission parts T, the reduced emission parts E, selectively emit light to display an image, require high efficiency, and must include a reflective metal layer, such as silver (Ag) or a silver (Ag) alloy, in the first electrode 145 because light emitted by the emission layer in the organic layer 150 needs to be reflected turn upwards without leaking downwards. In the display device according to the present disclosure, because the light emitting device OLED is provided in the emission part E having a narrow area and employs a highly reflective metal, the shape of the auxiliary connection pattern 147 formed to have the same layer structure as the first electrode 145 is changed so that the highly reflective metal vulnerable to heat or oxygen is not exposed to the outside, and thereby, deformation of the highly reflective metal may be prevented.

Therefore, the display device according to the present disclosure may improve luminous efficacy of the emission parts E and relatively increase the area of the transmission parts T, thereby exhibiting both improvement in luminous efficacy and an increase in the area of the transmission parts T.

The first electrode 145 and the auxiliary connection pattern 147 have a structure including a plurality of layers, formed by stacking at least the reflective metal layer 1452 and the first transparent electrode layer 1453. Further, at least the reflective metal layer 1452 of the auxiliary connection pattern 147 is spaced apart from the side wall of the bank 143, which is connected to the auxiliary wiring 130 and forms the first hole 143H1, by a designated distance, and overlaps the bank 143. The auxiliary connection pattern 147 has the void part UC located farther inwards than the side wall of the bank 143 by removing the thickness of the auxiliary connection pattern 147. Here, the removed thickness of the auxiliary connection pattern 147 may be the total thickness of the auxiliary connection pattern 147, or may be a part of the thickness of the auxiliary connection pattern 147.

In the display device according to the present disclosure, when a part of one layer of the auxiliary connection pattern 147 having the stack structure including the reflective metal layer and the transparent electrode layer is left, the remaining patterns of the respective layers may have different widths using an etchant having different etch rates for the two layers.

In the structure of the display device having transmission parts and emission parts, the use of wirings or metal layers for shielding light in the transmission parts is limited in order to transmit light in the transmission parts. In an area other than the transmission parts, pixel circuits including wirings and thin film transistors for driving subpixels are provided. Therefore, the pixel circuits including the wirings and the thin film transistors are also provided in the emission parts, and in order to overlay the wirings and the thin film transistors provided in the emission parts and to reflect light, emitted downward by the emission layers, upwards so as to improve luminous efficacy, the first electrodes (anodes) of the light emitting devices provided in the emission parts are essentially formed of a highly reflective metal.

For example, silver (Ag) or a silver (Ag) alloy is used as the highly reflective metal, when a protruding tip formed of the highly reflective metal is exposed to the atmosphere during a process, or the firing process of an organic film provided thereon is performed in the state in which the protruding tip is exposed, the shape of the protruding tip is deformed.

The display device according to the present disclosure is primarily characterized in that a structure for preventing exposure of a reflective metal layer is proposed in the situation in which the reflective metal layer is used. Not only in the display device having transmission parts, but also in a top emission-type display device having a structure in which a first electrode (anode) includes a reflective metal layer formed of silver (Ag) or a silver (Ag) alloy and a second electrode (cathode) is a transparent electrode, the same effects may be exhibited.

The display device according to the present disclosure includes the transmission parts T having a designated area or more so that the elements on the lower surface of the substrate 100 are visible, and the transmission parts T may transmit light like a kind of transparent film. When the transmission parts T are provided, the display device may be used as a transparent display device. Further, even though the display device according to the present disclosure does not include the transmission parts T, damage to the auxiliary connection part 147 formed to have the same layer structure of the first electrode 145 including a highly reflective metal may be prevented.

Further, the light emitting devices OLED including the first electrode 145, the organic layer 150 and the second electrode 160 are respectively provided in the emission parts E: E1, E2, E3 and E4, and may be selectively driven to emit light by turning on/off the thin film transistors conductively connected to the first electrodes 145 of the light emitting devices OLED. That is, the display device according to the present disclosure has both the transmission parts T and the emission parts E1, E2, E3 and E4, and may thus simultaneously realize light transmission and light emission. Here, the emission parts E1, E2, E3 and E4 are regions which emit light of green, red, blue and white, and respective color emission layers configured to emit light with different colors may be selectively provided in the corresponding emission parts E1, E2, E3 and E4, or the color filter layer 190 may be provided on the encapsulation layer structure 180 or an opposite substrate (not shown) so as to implement color display. In the latter, the light emitting devices OLED provided in the emission parts E1, E2, E3 and E4 of the respective subpixels may emit in common white light, and no color filter layer may be provided in the white emission parts. When voltage is applied through the thin film transistors connected to the emission parts E1, E2, E3 and E4, the respective emission parts E1, E2, E3 and E4 emit light with respective colors, thereby displaying an image.

The display device according to the present disclosure includes the subsidiary connection pattern having the same layer structure as the first electrode including a highly reflective metal, such as silver (Ag) or a silver (Ag) alloy, and has the void part provided by forming the auxiliary connection pattern farther inwards than the bank provided thereon, thereby being capable of improving the efficiency of the emission parts and preventing voltage drop of the second electrode through the undercut structure between the bank and the auxiliary connection pattern.

Further, in the display device according to the present disclosure, in the X-Y dimensions of the void part UC, the void part UC has a width of 0.4 μm to 1 μm so that the second electrode 160 is connected to the auxiliary connection pattern 147 or the auxiliary wiring 130 in the void part UC while the void part UC is sufficiently spaced from the organic layer 150 around the void part UC.

Hereinafter, the configuration of an auxiliary connection part in each of other aspects of the present disclosure will be descried in more detail.

Figure 4:
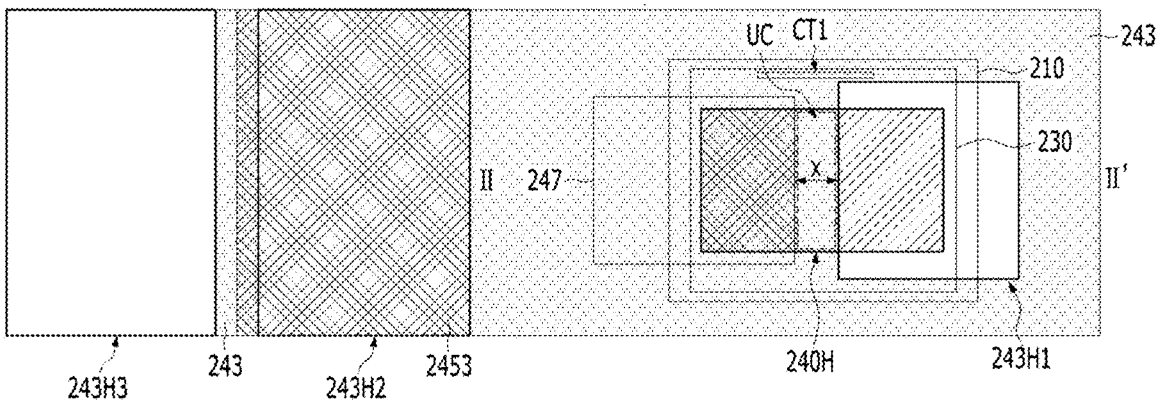
FIG. 4 is a plan view illustrating a display device according to a second aspect of the present disclosure.
Figure 5:
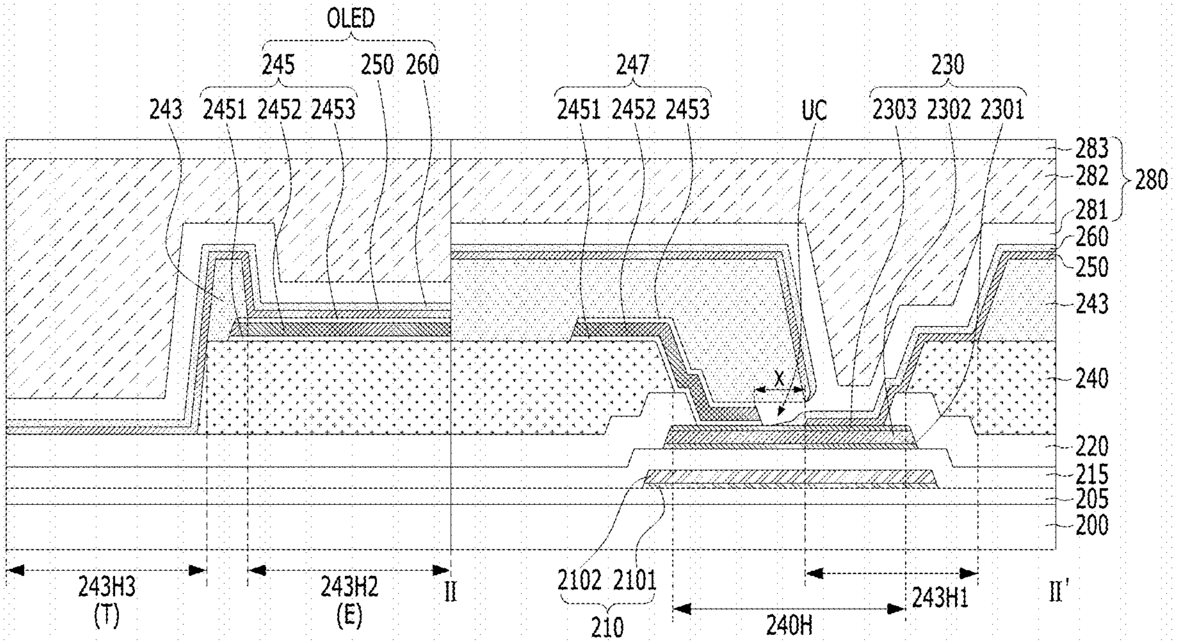
FIG. 5 is a cross-sectional view taken along line of FIG. 4.

FIG. 4 is a plan view illustrating a display device according to a second aspect of the present disclosure, and FIG. 5 is a cross-sectional view taken along line II-II' of FIG. 4.

As shown in FIGS. 4 and 5, the display device according to the second aspect of the present disclosure includes an auxiliary wiring 230 on a substrate 200, a bank 243 having a first hole 243H1 configured to expose a part of the auxiliary wiring 230 and second holes 243H2 configured to expose emission parts E, an auxiliary connection pattern 247 formed by stacking a reflective metal layer 2452 and a first transparent electrode layer 2453 between the auxiliary wiring 230 and the bank 243, connected to the auxiliary wiring 230, configured such that at least the reflective metal layer 2452 is spaced apart from the side wall of the bank 243 to form the first hole 243H1 by a first distance x, and provided to overlap the bank 243, and light emitting devices OLED provided in the emission parts E and including a first electrode 245 including the same materials as the auxiliary connection pattern 247, an organic layer 250 and a second electrode 260.

A second transparent electrode layer 2451 may be further provided under the reflective metal layer 2452 of the auxiliary connection pattern 247.

Here, the connection structure between the auxiliary wiring 230 and the second electrode 260 in the second aspect differs from the connection structure between the auxiliary wiring 130 and the second electrode 160 in the first aspect in that the void part UC is formed between the auxiliary wiring 230 and the bank 243 and thus the second electrode 260 is directly conductively connected to the auxiliary wiring 230. Further, the second transparent electrode layer 2451, the reflective metal layer 2452 and the first electrode layer 2453 of the auxiliary connection pattern 247 are integrated and patterned so as to have about the same width. The second electrode 260 may enter the void part UC and thus contact a part of the auxiliary connection pattern 247 or may not contact the auxiliary connection pattern 247, and, because the second electrode 260 is already conductively connected to the auxiliary wiring 230 provided thereunder, ground voltage may be more stably applied to the second electrode 260 through the auxiliary wiring 230.

A light-shielding layer 210 may be further provided below the auxiliary wiring 230 so as to overlap the auxiliary wiring 230, and the same electrical signal may be applied to the light-shielding layer 210 and the auxiliary wiring 230. In some cases, the light-shielding layer 210 may extend to a pad part, the active wiring 230 may be formed in an island type in the active area, and the auxiliary wiring 230 may be conductively connected to the light-shielding layer 210 through a first connection part CT1 so that a signal may be applied to the second electrode 260 via the light-shielding layer 210 and the auxiliary wiring 230.

The light-shielding layer 210 and the auxiliary wiring 230 respectively have a stack structure including layers 2102 and 2102 and a stack structure including layers 2301, 2302 and 2303, and the respective layers may be formed of a metal having high conductivity, such as aluminum (Al), chrome (Cr), copper (Cu), titanium (Ti), molybdenum (Mo) or tungsten (W), or an alloy including at least one of these metals.

A buffer layer 205 may be further provided between the substrate 200 and the light-shielding layer 210, an interlayer insulating film 215 may be further provided between the light-shielding layer 210 and the auxiliary wiring 230, and a passivation film 220 and an overcoat layer 240 may be further provided between the auxiliary wiring 230 and the auxiliary connection pattern 247 except for the first connection part CT1.

Here, the auxiliary connection pattern 247 may include a lower flat part which contacts the auxiliary wiring 230, a side connection part which extends from the lower flat part and contacts the side parts of the passivation film 220 and the overcoat layer 240 located between the auxiliary wiring 230 and the bank 243, and an upper flat part which extends from the side connection part and is located on the upper surface of the overcoat layer 240. The void part UC may be provided adjacent to the lower flat part.

The bank 243 may have the first hole 243H1 configured to expose a part of the auxiliary wiring 230, the second holes 243H2 configured to expose the emission parts E, and third holes 243H3 configured to expose the transmission parts T.

The organic layer 250 and the second electrode 260 are sequentially deposited on the bank 243 and in the first to third holes 243H1, 243H2 and 243H3. The second holes 243H2 and the third holes 243H3 correspond to the emission parts E and the transmission parts T, and the organic layer 250 formed in the emission parts E may be used to emit light. Here, because the organic layer 250 is formed to have straightness, the organic layer 250 is deposited in the first hole 243H1 without entering the void part UC covered by the bank 243 around the first hole 243H1. On the other hand, because the second electrode 260 has excellent step coverage, the second electrode 260 may enter the void part UC covered by the bank 243, and may thus be directly connected to the exposed flat upper surface of the auxiliary wiring 230.

An encapsulation layer structure 280 may be formed so as to overlie an area including the organic light emitting devices OLED on the substrate 200 except for pad electrodes 155 (with reference to FIG. 2) bonded to an external circuit film (not shown).

The encapsulation layer structure 280 is formed by alternately stacking inorganic encapsulation layers 281 and 283 and an organic encapsulation layer 282, and the inorganic encapsulation layers 281 and 283 extend farther outwards than the organic encapsulation layer 282 and are thus exposed to the outside so as to protect the organic encapsulation layer 282 which is relatively vulnerable to moisture.

The encapsulation layer structure 280 may be formed in the entirety of the active area AA and in a part of the non-active area around the active area AA.

The display device according to the present disclosure is primarily characterized in that a structure for preventing exposure of a reflective metal layer is proposed in the situation in which the reflective metal layer is used. Not only in the display device having transmission parts, but also in a top emission-type display device having a structure in which a first electrode (anode) includes a reflective metal layer formed of silver (Ag) or a silver (Ag) alloy and a second electrode (cathode) is a transparent electrode, the same effects may be exhibited.

The display device according to the present disclosure includes the transmission parts T having a designated area or more so that the elements on the lower surface of the substrate 200 are visible, and the transmission parts T may transmit light like a kind of transparent film. Further, the light emitting devices OLED including the first electrode 245, the organic layer 250 and the second electrode 260 are respectively provided in the emission parts E: E1, E2, E3 and E4, and may be selectively driven to emit light by turning on/off the thin film transistors conductively connected to the first electrodes 245 of the light emitting devices OLED. That is, the display device according to the present disclosure has both the transmission parts T and the emission parts E1, E2, E3 and E4, and may thus simultaneously realize light transmission and light emission. Here, the emission parts E are regions which emit light of green, red, blue and white, and respective color emission layers configured to emit light with different colors may be selectively provided in the corresponding emission parts E, or a color filter layer (not shown) may be provided on the encapsulation layer structure 280 or an opposite substrate (not shown) so as to implement color display. In the latter, the light emitting devices OLED provided in the emission parts E of the respective subpixels may emit in common white light, and no color filter layer may be provided in the white emission parts. When voltage is applied through the thin film transistors connected to the emission parts E, the respective emission parts E emit light with respective colors, thereby displaying an image.

The display device according to the present disclosure includes the subsidiary connection pattern 247 having the same layer structure as the first electrode 245 including a highly reflective metal, such as silver (Ag) or a silver (Ag) alloy, and has the void part provided by forming the auxiliary connection pattern 147 farther inwards than the bank 243 provided thereon, thereby being capable of improving the efficiency of the emission parts E and preventing voltage drop of the second electrode 260 through the undercut structure between the bank 243 and the auxiliary connection pattern 247.

Further, the second transparent electrode layer 2451, the reflective electrode layer 2452 and the first transparent electrode layer 2453 forming the auxiliary connection pattern 247 may have a stack structure of, for example, IZO/Ag—Pd—Cu (APC)/IZO in the upward direction. In this case, the three layers forming the auxiliary connection pattern 247 are primarily patterned, and are then secondarily patterned to have the same width after formation of the holes in the bank 243, and in this case, it is advantageous for the first and second transparent electrode layers 2453 and 2451 to be formed of the same material, i.e., IZO. When a transparent electrode layer is formed of ITO, ITO is crystallized during the firing process of the bank 243 and thus a defect may occur during secondary patterning, but when the transparent electrode layer is formed of IZO, IZO is scarcely deformed during the firing process of the bank 243 and thus patterning stability may be ensured.

Further, when both the first and second transparent electrode layers 2453 and 2451 are formed of IZO, the second transparent electrode layer 2451 located at the lowermost position of the auxiliary connection pattern 247 has excellent interface matching characteristics with the overcoat layer 240, and the first transparent electrode layer 2453 located at the uppermost position of the auxiliary connection pattern 247 has excellent matching characteristics with an organic material deposited thereon. Further, the reflective electrode layer 2452 occupying the majority of the thickness of the auxiliary connection pattern 247 and having conductivity is formed of a silver alloy, such as APC, thereby being capable of preventing cohesion of metal components and movement thereof. In this case, the first electrode 245 may also have the same layer structure as the auxiliary connection pattern 247, i.e., the stack structure of IZO/Ag—Pd—Cu (APC)/IZO in the upward direction.

Figure 6:
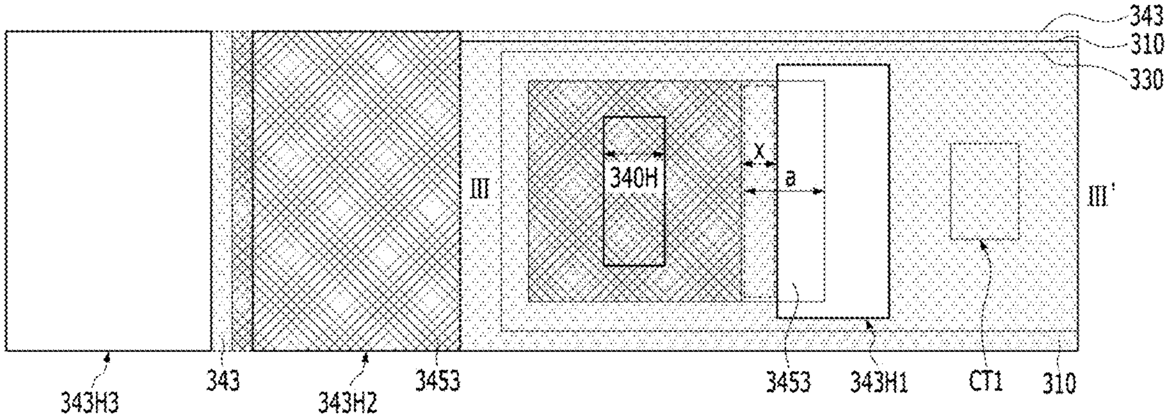
FIG. 6 is a plan view illustrating a display device according to a third aspect of the present disclosure.
Figure 7:
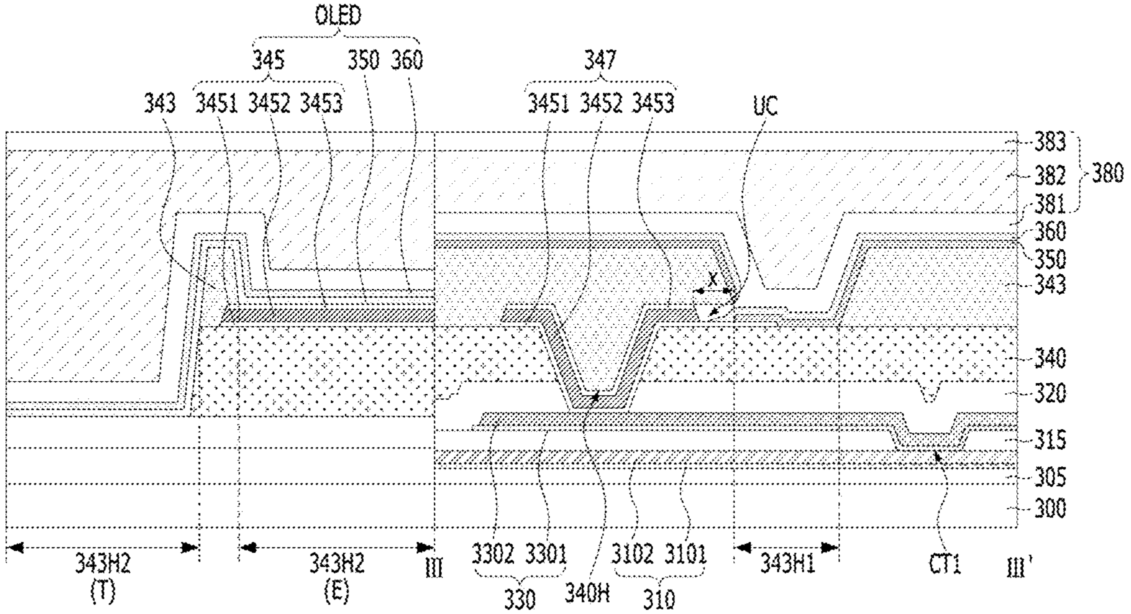
FIG. 7 is a cross-sectional view taken along line of FIG. 6.

FIG. 6 is a plan view illustrating a display device according to a third aspect of the present disclosure, and FIG. 7 is a cross-sectional view taken along line of FIG. 6.

As shown in FIGS. 6 and 7, the display device according to the third aspect of the present disclosure includes an auxiliary wiring 330 on a substrate 300, a bank 343 having a first hole 343H1 configured to expose a part of the auxiliary wiring 330 and second holes 343H2 configured to expose emission parts E, an auxiliary connection pattern 347 formed by stacking a reflective metal layer 3452 and a first transparent electrode layer 3453 between the auxiliary wiring 330 and the bank 343, connected to the auxiliary wiring 330, configured such that at least the reflective metal layer 3452 is spaced apart from the side wall of the bank 343 to form the first hole 343H1 by a first distance x, and provided to overlap the bank 343, and light emitting devices OLED provided in the emission parts E and including a first electrode 345 including the same materials as the auxiliary connection pattern 347, an organic layer 350 and a second electrode 360.

A second transparent electrode layer 3451 may be further provided under the reflective metal layer 3452 of the auxiliary connection pattern 347.

Here, the connection structure between the auxiliary wiring 330 and the second electrode 360 in the third aspect differs from the connection structure between the auxiliary wiring 230 and the second electrode 260 in the first aspect in that the second electrode 360 is not directly connected to the auxiliary wiring 330, but a part 3451 of the auxiliary connection pattern 347 has an extension, the extension enters a part of the first hole 343H1 via a void part UC, i.e., the second transparent electrode layer 3451 enters a part of the first holes 343H1 via the void part UC, and is thus connected to the second electrode 360. The connection structure in the third aspect is similar to the connection structure in the first aspect. The second electrode 360 is connected to the second transparent electrode layer 3451 of the auxiliary connection pattern on a flat overcoat layer 340, and thus, stable connection on the flat surface may be realized.

The second transparent electrode layer 3451, the reflective electrode layer 3452 and the first transparent electrode layer 3453 forming the auxiliary connection pattern 347 may have a stack structure of, for example, ITO/Ag—Pd—Cu (APC)/IZO in the upward direction. In this case, in order to selectively leave the second transparent electrode layer 3451 located at the lowermost position of the auxiliary connection pattern 347 in the void part UC, it is advantageous for the second transparent electrode layer 3451 to have an etch rate different from the etch rates of the first transparent electrode layer 3453 and the reflective metal layer 3452. Particularly, the second transparent electrode layer 3451 of the auxiliary connection pattern 347, which is left in the void part UC, is formed of a transparent electrode material, such as ITO, which may be crystallized during the firing process of the bank 344, and may thus improve conductivity when the second transparent electrode layer 3451 is directly connected to the second electrode 360 in the void part UC.

Further, it is advantageous for the first transparent electrode layer 3453 located at the uppermost position of the auxiliary connection pattern 347 to be formed of IZO, in order to improve matching characteristics with an organic material deposited on the first transparent electrode layer 3453 and to secure stability in secondary patterning after formation of the holes of the bank 343. Further, the reflective electrode layer 3452 occupying the majority of the thickness of the auxiliary connection pattern 347 and having conductivity is formed of a silver alloy, such as APC, thereby being capable of preventing cohesion of metal components and movement thereof. In this case, the first electrode 345 may also have the same layer structure as the auxiliary connection pattern 347, i.e., the stack structure of ITO/APC/IZO in the upward direction.

A light-shielding layer 310 may be further provided below the auxiliary wiring 330 so as to overlap the auxiliary wiring 330, the light-shielding layer 310 may be connected to the auxiliary wiring 330 through a first connection part CT1, and thus, the same electrical signal may be applied to the light-shielding layer 310 and the auxiliary wiring 330. In some cases, the light-shielding layer 310 may extend to a pad part, the active wiring 330 may be formed in an island type in the active area, and the auxiliary wiring 330 may be conductively connected to the light-shielding layer 310 through the first connection part CT1 so that a signal may be applied to the second electrode 360 via the light-shielding layer 310 and the auxiliary wiring 330.

The light-shielding layer 310 and the auxiliary wiring 330 respectively have a stack structure including layers 3102 and 3102 and a stack structure including layers 3301, 3302 and 3303, and the respective layers may be formed of a metal having high conductivity, such as aluminum (Al), chrome (Cr), copper (Cu), titanium (Ti), molybdenum (Mo) or tungsten (W), or an alloy including at least one of these metals.

A buffer layer 305 may be further provided between the substrate 300 and the light-shielding layer 310, an interlayer insulating film 315 may be further provided between the light-shielding layer 310 and the auxiliary wiring 330, and a passivation film 320 and the overcoat layer 340 may be further provided between the auxiliary wiring 330 and the auxiliary connection pattern 347 except for the first connection part CT1.

Here, the auxiliary connection pattern 347 may include a lower flat part which contacts the auxiliary wiring 330, a side connection part which extends from the lower flat part and contacts the side parts of the passivation film 320 and the overcoat layer 340 located between the auxiliary wiring 330 and the bank 343, and an upper flat part which extends from the side connection part and is located on the upper surface of the overcoat layer 340. The void part UC may be provided adjacent to the lower flat part.

The bank 343 may have the first hole 343H1 configured to expose a part of the auxiliary wiring 330, the second holes 343H2 configured to expose the emission parts E, and third holes 343H3 configured to expose the transmission parts T.

The organic layer 350 and the second electrode 360 are sequentially deposited on the bank 343 and in the first to third holes 343H1, 343H2 and 343H3. The second holes 343H2 and the third holes 343H3 correspond to the emission parts E and the transmission parts T, and the organic layer 350 formed in the emission parts E may be used to emit light. Here, because an organic material comprising the organic layer 350 is straight evaporated, the organic layer 350 is formed in the first hole 343H1 without entering the void part UC covered by the bank 343 around the first hole 343H1. On the other hand, because the second electrode 360 has excellent step coverage, the second electrode 360 may enter the void part UC covered by the bank 343, and may thus be directly connected to the second transparent electrode layer 3451 of the auxiliary connection pattern 347 on the overcoat layer 340.

An encapsulation layer structure 380 may be formed so as to overlie an area including the organic light emitting devices OLED on the substrate 300 except for pad electrodes 155 (with reference to FIG. 2) bonded to an external circuit film (not shown).

The encapsulation layer structure 380 is formed by alternately stacking inorganic encapsulation layers 381 and 383 and an organic encapsulation layer 382, and the inorganic encapsulation layers 381 and 383 extend farther outwards than the organic encapsulation layer 382 and are thus exposed to the outside so as to protect the organic encapsulation layer 382 which is relatively vulnerable to moisture. The inorganic encapsulation layers 381 and 383 may prevent ambient moisture or air from flowing into the display device, and the organic encapsulation layer 382 may prevent particles from moving in the display device and influencing the inside of the encapsulation layer structure 380.

The display device according to the present disclosure is primarily characterized in that a structure for preventing exposure of a reflective metal layer is proposed in the situation in which the reflective metal layer is used. Not only in the display device having transmission parts, but also in a top emission-type display device having a structure in which a first electrode (anode) includes a reflective metal layer formed of silver (Ag) or a silver (Ag) alloy and a second electrode (cathode) is a transparent electrode, the same effects may be exhibited.

The display device according to the present disclosure includes the transmission parts T having a designated area or more so that the elements on the lower surface of the substrate 300 are visible, and the transmission parts T may transmit light like a kind of transparent film. Further, the light emitting devices OLED including the first electrode 345, the organic layer 350 and the second electrode 360 are respectively provided in the emission parts E: E1, E2, E3 and E4, and may be selectively driven to emit light by turning on/off the thin film transistors conductively connected to the first electrodes 345 of the light emitting devices OLED. That is, the display device according to the present disclosure has both the transmission parts T and the emission parts E1, E2, E3 and E4, and may thus simultaneously realize light transmission and light emission. Here, the emission parts E are regions which emit light of green, red, blue and white, and respective color emission layers configured to emit light with different colors may be selectively provided in the corresponding emission parts E, or a color filter layer (not shown) may be provided on the encapsulation layer structure 380 or an opposite substrate (not shown) so as to implement color display. In the latter, the light emitting devices OLED provided in the emission parts E of the respective subpixels may emit in common white light, and no color filter layer may be provided in the white emission parts. When voltage is applied through the thin film transistors connected to the emission parts E, the respective emission parts E emit light with respective colors, thereby displaying an image.

In the display device according to the third aspect of the present disclosure, because a connection hole 340H for connection between the auxiliary wiring 330 and the auxiliary connection pattern 347 and the first hole 343H1 for connection between the auxiliary connection pattern 347 and the second electrode 360 are formed in different layers, margins of regions for the connection hole 340H and the first hole 343H1 may be stably secured.

The display device according to the present disclosure includes the subsidiary connection pattern having the same layer structure as the first electrode including a highly reflective metal, such as silver (Ag) or a silver (Ag) alloy, and has the void part provided by forming the auxiliary connection pattern farther inwards than the bank provided thereon, thereby being capable of improving the efficiency of the emission parts and preventing voltage drop of the second electrode through the undercut structure between the bank and the auxiliary connection pattern. That is, nonuniformity in the resistance of the second electrode among regions may be prevented, and thus, afterimage prevention and image stabilization may be promoted.

Particularly, in the structure of a transparent display device which has both transmission parts and emission parts, the use of wirings or metal layers for shielding light in the transmission parts is limited in order to transmit light in the transmission parts, and in the emission parts in which some wirings and thin film transistors need to be provided, when an auxiliary connection pattern includes a reflective metal layer having a designated thickness or more, the auxiliary connection pattern forms a void part by selectively removing the reflective metal layer so as to prevent deposition of an organic layer therein, shields the wirings and the thin film transistors provided in the emission parts, and reflects light, emitted downwards by emission layers, upwards so as to improve luminous efficacy.

In the structure in which the first electrode essentially uses a highly reflective metal, such as Ag or an Ag alloy, the auxiliary connection pattern having the same layer structure as the first electrode, the reflective metal layer formed of the highly reflective metal may be located father inwards than the bank so as to prevent oxidation of the reflective metal layer or shape deformation of the reflective metal layer. Thereby, more stable connection between the second electrode and the auxiliary wiring (or the auxiliary connection pattern) may be realized.

Hereinafter, an example of an undercut structure between a bank and an auxiliary connection pattern having the same layer structure as a first electrode, proposed by the inventors of the present disclosure, will be described.

Figure 8:
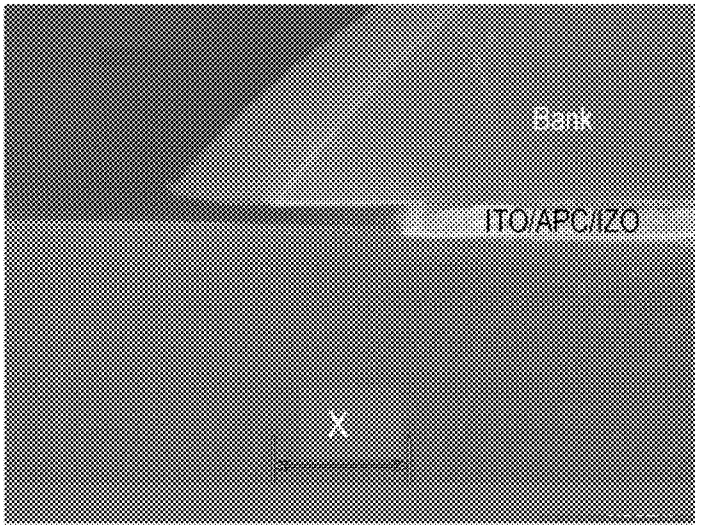
FIG. 8 is an SEM image showing a bank and an auxiliary connection pattern when the display device according to the second aspect of the present disclosure is applied.

FIG. 8 is an SEM image showing a bank and an auxiliary connection pattern when the display device according to the second aspect of the present disclosure is applied.

As shown in FIG. 8, it may be confirmed that, when an auxiliary connection pattern having a layer structure including a transparent layer (ITO), a reflective metal layer (Ag—Pd—Cu: APC) and a transparent layer (IZO), which are sequentially stacked in the upward direction, is formed, a bank, which protrudes farther outwards than the auxiliary connection pattern is formed, and a void part is formed under the lower surface of the bank by removing the auxiliary connection pattern, exposure of the auxiliary connection pattern to ambient air may be prevented and thus deformation of the reflective metal layer may be prevented.

In the display device according to the present disclosure, in order to transmit light in transmission parts T of a substrate, a second electrode in an integral type is formed in common not only in emission parts E: E1, E2, E3 and E4 of the substrate but also in the transmission parts. Even in a situation in which the second electrode (cathode) is provided in the transmission parts T, in order to secure transmittance of equal to or greater than a designated level, the second electrode (cathode) may be a transparent oxide electrode formed of indium tin oxide (ITO), tin oxide (TO), indium zinc oxide (IZO) or indium tin zinc oxide (ITZO). In contrast, a first electrode (anode) for light emitting devices OLED is formed only in the emission parts E: E1, E2, E3 and E4, and in order to output light upwards from the second electrode while increasing the resonance effect in an emission layer between the first electrode and the second electrode without optical loss, the first electrode includes a reflective electrode. For example, the reflective electrode may be formed of Ag, an Ag alloy, Al, an Al alloy, Cu, a Cu alloy, Cr, a Cr alloy, Mo or a Mo alloy.

Like the display device according to the present disclosure, in a structure in which the transmission parts T require a designated size and thus the individual sizes of the emission parts E: E1, E2, E3 and E4 are reduced, the area of each of the emission parts E: E1, E2, E3 and E4 is small and optical loss may occur through the rear surface of the adjacent transmission part T, and thus, high luminous efficacy which exhibits high luminance is required. For this purpose, the first electrode requires a highly reflective metal, such as Ag or an Ag alloy (for example, APC), as the reflective electrode included in the first electrode. As the inventors of the present disclosure define the void part UC in the display device, the inventors confirmed that, because when the first electrode used as a dummy pattern protrudes into the void part, as shown in FIG. 3, the reflective electrode formed of Ag or an Ag alloy, which is vulnerable to heat, is oxidized at an exposed portion thereof during a process and may thus be deformed, it is difficult to leave the reflective electrode in the void part UC, and, with this point of view, changed the configuration of the void part UC as in the first to third aspects. That is, by forming the void part UC between the auxiliary connection pattern having the same layer structure as the first electrode and the bank such that the void part UC is located farther inwards than the bank, exposure of the auxiliary connection pattern, particularly, the reflective metal layer, to ambient air is prevented. Thereby, oxidation or deformation of the reflective metal layer may be prevented and the void part UC may be stably maintained, thereby being capable of securing conductive connection between the second electrode and the auxiliary wiring or the auxiliary connection pattern.

The first electrode may function as an anode and the second electrode may function as a cathode in the light emitting device. The first electrode is divided depending on the respective subpixels, and is independently connected to thin film transistors TFT and thus receives signals applied from the thin film transistors TFT. The thin film transistors TFT are connected to gate lines (not shown) and data lines (not shown) intersecting each other, and may thus receive signals from the gate lines and the data lines. Each subpixel includes at least two thin film transistors conductively connected to the light emitting device OLED and at least one storage capacitor. The driving thin film transistor TT connected to the first electrode of the light emitting device OLED may be connected to a power supply voltage line VDDL provided in parallel to the data lines DL so as to apply power supply voltage VDD, and the second electrode may be connected to the auxiliary wiring configured to apply ground voltage VSS.

In the display device according to the present disclosure, the auxiliary wiring may be formed of the same metal in the same layer as the light-shielding layer 110 (with reference to FIG. 2), or may be formed of the same metal in the same layer of the gate lines or the data lines. In some cases, the auxiliary wiring 130, 230 or 330 may be formed integrally with the respective wirings or lines. The auxiliary wiring 130, 230 or 330, the light-shielding layer 110, and the gate lines or the data lines may be formed by the same process.

The auxiliary connection patterns 147, 247 or 347 may include a reflective metal layer and at least one transparent electrode layer, the void part is formed under the bank by removing at least the reflective metal layer by a first distance, and thereby, exposure of the reflective metal layer of the auxiliary connection pattern rather than the bank may be prevented.

For this purpose, a display device according to one aspect the present disclosure may include a display device including an auxiliary wiring on a substrate, a bank configured to include a first hole configured to expose a part of the auxiliary wiring and second holes configured to expose emission parts, an auxiliary connection pattern formed by stacking a reflective metal layer and a first transparent electrode layer between the auxiliary wiring and the bank, configured such that at least the reflective metal layer is spaced apart from a side wall of the bank configured to form the first hole by a first distance, and connected to the auxiliary wiring, and light emitting devices respectively provided in the emission parts, and including a first electrode including the same materials as the auxiliary connection pattern, an organic layer and a second electrode.

The thickness of the reflective metal layer included in the first electrode and the auxiliary connection pattern may be greater than the sum of the thickness of the organic layer and the thickness of the second electrode.

A void part corresponding to a thickness of the auxiliary connection pattern may be provided within the first distance under the bank.

The second electrode may be located farther inwards than the organic layer by the first distance, and may be conductively connected to the auxiliary wiring.

The display device may further include a second transparent electrode layer provided under the reflective metal layer.

The second transparent electrode layer may extend to the first distance and into the first hole, and the second electrode may be directly connected to the second transparent electrode layer.

The reflective metal layer may include silver (Ag).

The first electrode may be formed by sequentially stacking an IZO layer, an APC layer and an IZO layer in an upward direction.

The first electrode may be formed by sequentially stacking an ITO layer, an APC layer and an IZO layer in an upward direction.

The bank may further include third holes configured to correspond to transmission parts spaced apart from the auxiliary wiring and the first hole.

The first distance may be within a range of 0.4 μm to 1.0 μm.

The auxiliary connection pattern may include a lower flat part configured to contact the auxiliary wiring, a side connection part configured to extend from the lower flat part and to contact side parts of a passivation film and an overcoat layer located between the auxiliary wiring and the bank, and an upper flat part configured to extend from the side connection part and located on an upper surface of the overcoat layer.

A display device according to another aspect of the present disclosure may include an auxiliary wiring on a substrate, a bank configured to include a first hole configured to expose a part of the auxiliary wiring, second holes configured to expose emission parts, and third holes configured to expose transmission parts, an auxiliary connection pattern formed by stacking a reflective metal layer and a first transparent electrode layer between the auxiliary wiring and the bank, configured such that at least the reflective metal layer is spaced apart from a side wall of the bank configured to form the first hole by a first distance, and connected to the auxiliary wiring, and light emitting devices respectively provided in the emission parts, and including a first electrode including the same materials as the auxiliary connection pattern, an organic layer, and a second electrode connected to the auxiliary wiring or the auxiliary connection pattern within the first distance.

The thickness of the reflective metal layer included in the first electrode and the auxiliary connection pattern may be greater than the sum of the thickness of the organic layer and the thickness of the second electrode.

A void part corresponding to a thickness of the auxiliary connection pattern may be provided within the first distance under the bank.

The display device may further include a second transparent electrode layer provided under the reflective metal layer.

The second transparent electrode layer may extend to the first distance part and into the first hole, and the second electrode may be directly connected to the second transparent electrode layer.

The reflective metal layer may include silver (Ag).

The auxiliary connection pattern may include a lower flat part configured to contact the auxiliary wiring, a side connection part configured to extend from the lower flat part and to contact side parts of a passivation film and an overcoat layer located between the auxiliary wiring and the bank, and an upper flat part configured to extend from the side connection part and located on an upper surface of the overcoat layer.

As is apparent from the above description, a display device according to the present disclosure has the following effects.

First, the display device according to the present disclosure includes a subsidiary connection pattern having the same layer structure as a first electrode (anode) including a highly reflective metal, such as silver (Ag) or a silver (Ag) alloy, and has a void part provided by forming the auxiliary connection pattern farther inwards than a bank provided thereon so as to form an undercut structure between the bank and the auxiliary connection pattern, thereby being capable of stably connecting a second electrode (cathode) to the auxiliary connection pattern and thus improving the efficiency of emission parts and preventing voltage drop of a second electrode through. That is, nonuniformity in the resistance of the second electrode among regions may be prevented, and thus, afterimage prevention and image stabilization may be promoted.

Second, in the structure of a transparent display device which has both transmission parts and emission parts, the use of wirings or metal layers for shielding light in the transmission parts is limited in order to transmit light in the transmission parts, and in the emission parts in which some wirings and thin film transistors need to be provided, when an auxiliary connection pattern includes a reflective metal layer having a designated thickness or more, the auxiliary connection pattern forms a void part by selectively removing the reflective metal layer so as to prevent deposition of an organic layer therein, shields the wirings and the thin film transistors provided in the emission parts, and reflects light, emitted downwards by emission layers, upwards so as to improve luminous efficacy.

Third, in the structure in which the first electrode essentially uses a highly reflective metal, such as Ag or an Ag alloy, the auxiliary connection pattern having the same layer structure as the first electrode, the reflective metal layer formed of the highly reflective metal may be located father inwards than the bank so as to prevent oxidation of the reflective metal layer or shape deformation of the reflective metal layer. Thereby, more stable connection between the second electrode and the auxiliary wiring (or the auxiliary connection pattern) may be realized.

It will be apparent to those skilled in the art that various modifications and variations can be made in the present disclosure without departing from the spirit or scope of the disclosure. Thus, it is intended that the present disclosure cover the modifications and variations of this disclosure provided they come within the scope of the appended claims and their equivalents.

What is claimed is:

1. A display device comprising:

an auxiliary wiring disposed on a substrate;

a bank including a first hole to expose a part of the auxiliary wiring and a second hole to expose an emission part;

a light emitting device disposed at the emission part and including a first electrode, an organic layer and a second electrode; and an auxiliary connection pattern including a reflective metal layer and a first transparent electrode layer between the auxiliary wiring and the bank, the auxiliary connection pattern connected to the auxiliary wiring, wherein the first electrode of the light emitting device includes a first layer as a same layer as the reflective metal layer and a second layer as a same layer as the first transparent electrode layer, wherein at least the reflective metal layer of the auxiliary connection pattern is horizontally spaced apart from a side wall of the bank to form the first hole, and wherein the reflective metal layer of the auxiliary connection pattern does not overlap with the side wall of the bank adjacent to the first hole.

2. The display device according to claim 1, wherein a thickness of each of the first layer of the first electrode and the reflective metal layer of the auxiliary connection pattern is greater than a sum of a thickness of the organic layer and a thickness of the second electrode.

3. The display device according to claim 1, wherein the auxiliary connection pattern includes a void part corresponding to a thickness of the auxiliary connection pattern, and the void part is provided where the reflective metal layer is not disposed under the bank.

4. The display device according to claim 1, wherein the second electrode is located farther inwards than the side wall of the bank configured to form the first hole and electrically connected to the auxiliary wiring under the bank.

5. The display device according to claim 1, further comprising a second transparent electrode layer disposed under the reflective metal layer.

6. The display device according to claim 5, wherein the second transparent electrode layer further protrudes the reflective metal layer and extends to the first hole, and the second electrode is directly connected to the second transparent electrode layer where the reflective metal layer is not disposed under the bank.

7. The display device according to claim 1, wherein the reflective metal layer includes silver (Ag).

8. The display device according to claim 1, wherein the first electrode is a stack of an IZO layer, an APC layer and an IZO layer sequentially stacked in an upward direction.

9. The display device according to claim 1, wherein the first electrode is a stack of an ITO layer, an APC layer and an IZO layer sequentially stacked in an upward direction.

10. The display device according to claim 1, wherein the bank further comprises a third hole corresponding to a transmission part, the third hole spaced apart from the auxiliary wiring and the first hole.

11. The display device according to claim 1, wherein the at least the reflective metal layer is horizontally spaced apart from the side wall of the bank configured to form the first hole within a range of 0.4 μm to 1.0 μm.

12. The display device according to claim 1, wherein the auxiliary connection pattern comprises a lower flat part contacting the auxiliary wiring, a side connection part extending from the lower flat part and contacting side parts of a passivation film and an overcoat layer between the auxiliary wiring and the bank, and an upper flat part extending from the side connection part and located on an upper surface of the overcoat layer.

13. A display device comprising:

an auxiliary wiring on a substrate;

a bank including a first hole that exposes a part of the auxiliary wiring, a second hole that exposes an emission part, and a third hole that exposes a transmission part;

an auxiliary connection pattern formed of stacks of a reflective metal layer and a first transparent electrode layer between the auxiliary wiring and the bank, the auxiliary connection pattern connected to the auxiliary wiring; and a light emitting device at the emission part, and the light emitting device including a first electrode, an organic layer, and a second electrode, wherein the first electrode of the light emitting device includes a first layer as a same layer as the reflective metal layer and a second layer as a same layer as the first transparent electrode layer, wherein at least the reflective metal layer of the auxiliary connection pattern is horizontally spaced apart from a side wall of the bank to form the first hole, and wherein the reflective metal layer of the auxiliary connection pattern does not overlap with the side wall of the bank adjacent to the first hole.

14. The display device according to claim 13, wherein a thickness of each of the first layer of the first electrode and the reflective metal layer of the auxiliary connection pattern is greater than a sum of a thickness of the organic layer and a thickness of the second electrode.

15. The display device according to claim 13, wherein the auxiliary connection pattern includes a void part corresponding to a thickness of the auxiliary connection pattern and the void part is provided where the reflective metal layer is not disposed under the bank.

16. The display device according to claim 13, further comprising a second transparent electrode layer disposed under the reflective metal layer.

17. The display device according to claim 16, wherein the second transparent electrode layer further protrudes the reflective metal layer and extends to the first hole, and the second electrode is directly connected to the second transparent electrode layer where the reflective metal layer is not disposed under the bank.

18. The display device according to claim 13, wherein the reflective metal layer comprises silver (Ag).

19. The display device according to claim 13, wherein the auxiliary connection pattern comprises a lower flat part contacting the auxiliary wiring, a side connection part extending from the lower flat part and contacting side parts of a passivation film and an overcoat layer between the auxiliary wiring and the bank, and an upper flat part extending from the side connection part and located on an upper surface of the overcoat layer.

* * * * *